US012704542B2

(12) United States Patent
Yu et al.

(10) Patent No.: US 12,704,542 B2
(45) Date of Patent: Aug. 11, 2026

(54) MEMS DEVICE MEASUREMENTS USING PULSE MEASURE UNIT

(71) Applicant: Keithley Instruments, LLC, Solon, OH (US)

(72) Inventors: Jin Kwang Yu, Hudson, OH (US); Alexander N. Pronin, Twinsburg, OH (US)

(73) Assignee: Kethley Instruments, LLC, Solon, OH (US)

( * ) Notice: Subject to any disclaimer, the term of this patent is extended or adjusted under 35 U.S.C. 154(b) by 280 days.

(21) Appl. No.: 18/510,648

(22) Filed: Nov. 16, 2023

(65) Prior Publication Data

US 2024/0168082 A1 May 23, 2024

Related U.S. Application Data

(60) Provisional application No. 63/426,652, filed on Nov. 18, 2022.

(51) Int. Cl.

*G01R 31/28* (2006.01)
*G01R 1/067* (2006.01)
*G01R 1/073* (2006.01)

(52) U.S. Cl.

CPC ..... *G01R 31/2829* (2013.01); *G01R 1/06766* (2013.01); *G01R 1/07342* (2013.01)

(58) Field of Classification Search

None

See application file for complete search history.

(56) References Cited

U.S. PATENT DOCUMENTS

| | | | | |
|---|---|---|---|---|
| 6,304,095 | B1 * | 10/2001 | Miyamoto | G01R 31/01 324/754.03 |
| 8,921,128 | B2 * | 12/2014 | Chen | B81C 99/0045 73/49.3 |
| 9,034,666 | B2 * | 5/2015 | Vaganov | G06F 3/0338 324/750.01 |
| 10,101,365 | B2 * | 10/2018 | Nakata | G01R 31/31924 |
| 10,364,147 | B2 * | 7/2019 | Rossi | G01R 31/2889 |
| 11,428,722 | B2 * | 8/2022 | Wu | G01R 27/08 |
| 11,841,381 | B2 * | 12/2023 | Wang | G01R 1/07385 |
| 12,298,341 | B2 * | 5/2025 | Fritsch | B81C 99/0045 |
| 2006/0243023 | A1 * | 11/2006 | Wong | B81C 99/0045 324/754.21 |

* cited by examiner

*Primary Examiner* — Richard Isla

(74) *Attorney, Agent, or Firm* — Miller Nash LLP; Andrew J. Harrington; Krista Y. Chan

(57) ABSTRACT

Methods and systems of testing microelectromechanical (MEMS) devices are disclosed. A method includes mechanically coupling a wafer including MEMS devices to a test system and electrically coupling one of the MEMS devices through a probe card to a pulse measure unit (PMU) of the test system. The method includes driving, through the PMU, drive nodes of the MEMS device with an applied time-varying electrical signal to cause a resonance condition of the MEMS device, and sensing, through the PMU, an electrical signal generated across sense nodes of the MEMS device responsive to the resonance condition. A resonance frequency and quality factor of the MEMS device are determined based on the sensed electrical signals across the sense nodes of the MEMS device, and whether the MEMS device passes a quality factor test is made based on the calculated quality factor.

23 Claims, 6 Drawing Sheets

MEMS DEVICE MEASUREMENTS USING PULSE MEASURE UNIT

REFERENCE TO RELATED APPLICATIONS

This disclosure claims benefit of U.S. Provisional Application No. 63/426,652, titled "MEMS DEVICE MEASUREMENTS USING PULSE MEASURE UNIT," filed on Nov. 18, 2022, the disclosure of which is incorporated herein by reference in its entirety.

TECHNICAL FIELD

The present disclosure relates generally to test and measurement instruments, and more particularly to methods and systems of testing microelectromechanical (MEMS) devices using a pulse measure unit (PMU) in conjunction with or as a part of a test and measurement instrument.

BACKGROUND OF THE INVENTION

During fabrication of a semiconductor device, electronic circuits are created through integrated circuits formed on a semiconductor wafer, and the wafer is then diced into individual dies or chips, each die or chip including a respective integrated circuit. Before dicing, the integrated circuits are generally subjected to electrical tests to determine if the circuits function according to their design specifications. Typically, the wafer is mounted, such as by vacuum mounting, to a wafer chuck of a machine called a wafer prober, and the wafer is brought into contact with one or more probe needles of a probe card. In this way, an electrical connection is made between contact pads of an integrated circuit on the wafer and tips of the probe needles, allowing the integrated circuit to be electrically coupled through probe card to a test and measurement system that tests the integrated circuit for proper functionality.

One type of integrated circuit that may be formed on a semiconductor wafer is a Micro-Electro-Mechanical Systems (MEMS) device including micro-mechanical components, such as sensors and actuators, in combination with electronic circuits formed on the die. MEMS devices may be micromechanical resonator type devices, such as gyroscopes or accelerometers, where a moveable micro-mechanical component resonates in response to a driving electrical signal and variations in this movement are sensed through micro-mechanical components that are fixed or stationary relative to the moveable component. Manufacturers of such MEMS devices test these devices fabricated on a wafer during production to ensure proper operation prior to dicing and packaging of the dies including the MEMS devices.

Conventional methods for testing MEMS devices fabricated on a wafer are not adequate for manufacturers as the methods are too slow to meet production requirements, not compatible with the production environment, or both. For example, current approaches typically include coupling an arbitrary waveform generator (AWG) to drive the MEMS device, and may require a preamplifier be coupled to the AWG to provide signals at sufficient voltage and currents levels to drive the MEMS device. Signal capture circuitry to digitize signals generated on sense nodes of the MEMS device is also coupled to the MEMS device, and a data set formed by these digitized signals is provided to a spectrum analyzer for analysis of the signals and a determination of a resonance frequency and quality factor (Q) of the MEMS device. The coupling of these components must be done for each MEMS device on a wafer. In view of these limitations of current MEMS testing approaches, there is a need for improved methods and systems for testing MEMS devices on a wafer that satisfies the speed required in a production environment during manufacture of the MEMS devices.

BRIEF DESCRIPTION OF THE DRAWINGS

Aspects, features and advantages of examples of the present disclosure will become apparent from the following description of examples in reference to the appended drawings in which.

DESCRIPTION

Embodiments of the present disclosure utilize a pulse measure unit (PMU) in a semiconductor test and measurement system or instrument to perform quality factor (Q) testing of MEMS devices in a fabrication or production environment. The utilization of the PMU enables improved testing of MEMS devices and reduces the equipment required to perform the testing, such as a preamplifier required in conventional approaches to excite or drive the MEMS devices with a drive signal having sufficient voltage and current levels. In addition, the PMU in combination with the test and measurement system also enables automated testing of all MEMS devices on each wafer. These factors reduce the time required for testing wafers and enable MEMS device testing in a production environment.

In some embodiments, the PMU is contained in an S530 Parametric Test System manufactured by Keithley Instruments, Inc. of Solon, Ohio. The PMU provides unique capabilities for driving and sensing signals applied to and generated by the MEMS devices. Integration of the PMU into the S530 system allows measurements to be performed on any pin of a probe card of the system, with no need for a dedicated low noise connection be provided for driving and sensing signals of the MEMS devices. Furthermore, in embodiments of the present disclosure the PMU performs measurement of both the drive signals provided to the MEMS device and sense signals generated by the MEMS device in response to a resonance condition of the device. Measuring or sensing the drive signals enables monitoring of the actual characteristics of the drive signals applied to each MEMS device during testing. In addition, the PMU also enables sensing of signals generated on both drive nodes or electrodes as well as signals on sense node or electrodes of the MEMS device during resonance, providing additional data to a user for characterizing each MEMS device during testing.

Figure 1:
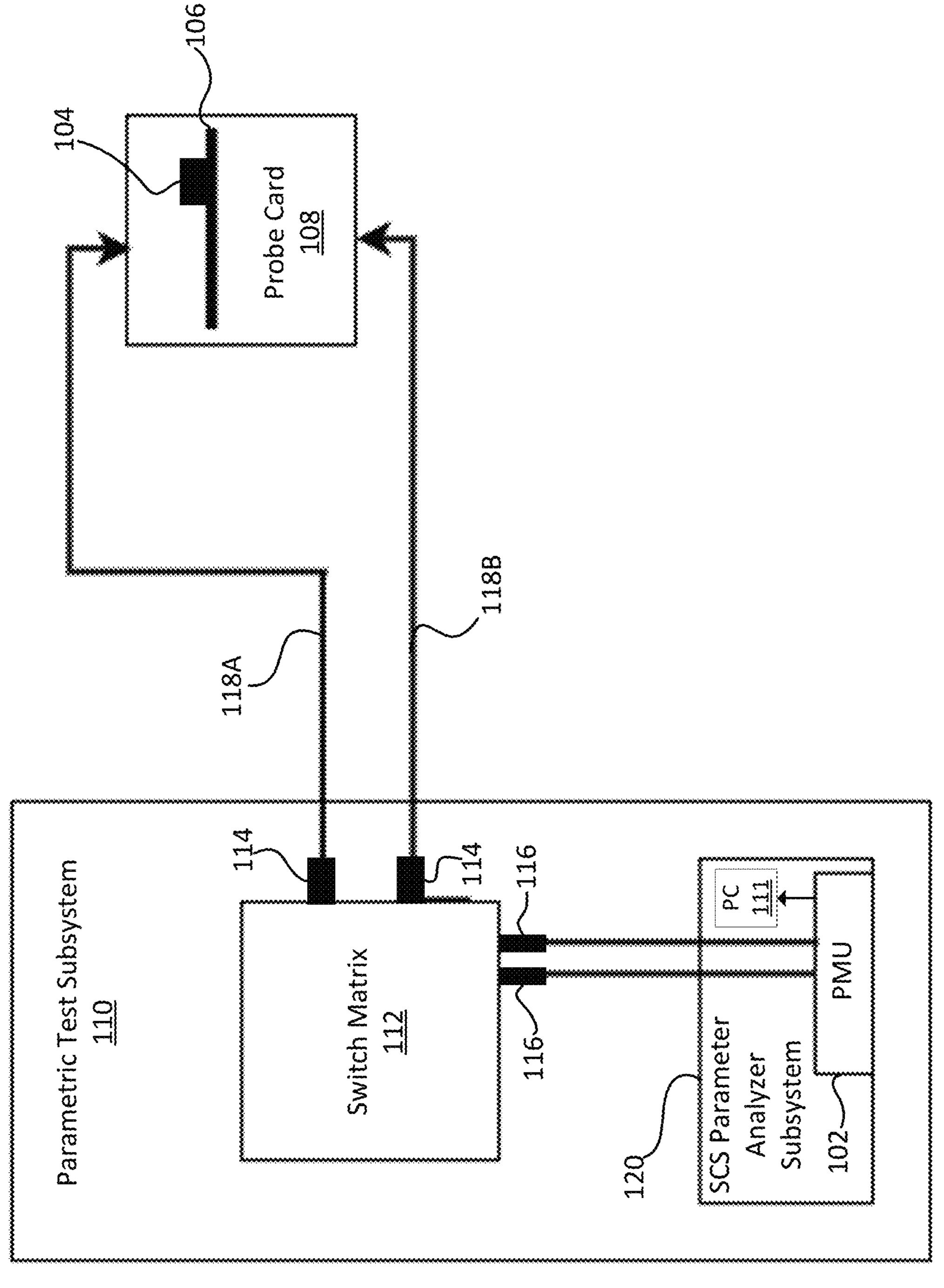
FIG. 1 is a functional block diagram of a test and measurement system including a pulse measure unit (PMU) for testing MEMS devices in a production environment according to embodiments of the present disclosure.

FIG. 1 is a functional block diagram of a test and measurement system 100 including a pulse measure unit (PMU) 102 for testing MEMS devices 104 on a wafer 106 in a production environment according to embodiments of the present disclosure. The test and measurement system 100 includes a probe card 108 having a multitude of pins (not shown) that are configured to be electrically coupled to the MEMS devices 104 on the wafer 106. Only one MEMS device 104 is illustrated in FIG. 1 on the wafer 106 to simplify the figure, and the wafer generally includes a number of such MEMS devices. The test and measurement system 100 further includes a parametric test subsystem 110 containing a switch matrix 112 having a multitude of probe card nodes or pins 114 and a multitude of instrument nodes or pins 116, with only two of each type of pin being shown in FIG. 1 by way of example to simply the figure. The probe card pins 114 of the switch matrix 112 are electrically coupled through connections 118A, 118B to the probe card 108, and through the probe card to the MEMS devices 104 on the wafer 106. In operation, the switch matrix 112 is configured to couple each probe card pin 114 to a selected one of the instrument card pins 116. In this way, the switch matrix 112 provides electrical signal pathways between respective probe card pins 114 and respective instrument pins 116 to electrically connect the PMU 102, through the switch matrix, connections 118A, 118B, and probe card 108, to selected MEMS devices 104 on the wafer 106. The parametric test subsystem 110 includes a semiconductor characterization system (SCS) parameter analyzer subsystem 120 that is coupled to the instrument nodes 116 of the switch matrix 112, with the PMU 102 being contained in the parametric test subsystem 110. In further embodiments of the test and measurement system 100, the PMU 102 may be included in other types of test subsystems, integrated directly as part of the test subsystem 110, or may be operated as a separate, standalone device.

In operation, the parametric test subsystem 110 controls the parametric analyzer subsystem 120 and thereby the PMU 102 to supply drive signals through the switch matrix 112, connection 118A, and probe card 108 to drive the MEMS device 104 being tested. The PMU 102 also senses or measures sense signals generated by the MEMS device 102 responsive to a resonance condition caused by the drive signals from the PMU, with the sense signals being coupled to the PMU through the probe card 108, connections 118A, 118B, and switch matrix 112. The PMU 102 generates a data set from the measured sense signals and processing circuitry (PC) 111 in the parametric analyzer subsystem 120 then processes or analyzes this data set to calculate a resonance frequency and determine a quality factor Q for the MEMS device. The processing circuitry 111 then determines whether the MEMS device passes a quality factor Q test based on the calculated quality factor. In other embodiments, the data set generated by the PMU 120 is supplied to the test subsystem 110 for analysis to determine the resonance frequency and the quality factor Q of the MEMS device, and to determine if the MEMS device passes the Q test.

The parametric test subsystem 110 repeats these operations for each MEMS device 104 on the wafer 106 to automatically perform testing of all MEMS devices on the wafer. As part of this process of testing all MEMS devices 104 on the wafer 106, the parametric test subsystem 110 also controls the probe card 108 to sequentially position the probe card to mechanically and electrically couple to the MEMS device 104 to be tested. In this way, the parametric test subsystem 110 automatically controls the probe card 108 to sequentially test all the MEMS devices 104 on the wafer 106. One skilled in the art will understand the structure and operation of the probe card 108 in providing an electromechanical interface between the parametric test subsystem 110 and the MEMS devices 104 on the wafer 106. Accordingly, the probe card will not be described in detail herein for brevity. Briefly, the probe card 106 includes probe needles that are conductive and are moveable relative to the wafer 106. The probe needles are positioned so that tips of the probe needles touch contact pads on the wafer. Each MEMS device 104 includes contact pads on the wafer 106 to allow for electrical connection to the MEMS device. Through control of the probe card 108 to position tips of the probe needles to touch the contact pads of a selected MEMS device 104, an electrical connection is made between the selected MEMS device and the parametric test subsystem 110 to allow for testing of the MEMS device.

In some embodiments of the present disclosure, the PMU 102 has several unique capabilities and is a card in the Keithley Instruments S4200A characterization system. The S4200A characterization system accordingly corresponds to the SCS parameter analyzer subsystem 120 and the parametric test subsystem 110 is the Keithley S530 Parametric Test System. Software running on the S4200 characterization system controls the PMU 102 to generate desired drive signals that are applied to MEMS device being tested, and to capture data from the MEMS device and extract resonance frequency and quality factor Q from this data. The extracted data may then be supplied to the S530 system for data reporting. In some embodiments, the PMU 102 is the Keithley 4225-PMU that is configured to apply pulse signals having pulse widths that may vary from 60 ns to DC signals to thereby generate the time-varying electrical signal. The 4225-PMU may be further configured to sample, at a rate of up to 200 mega samples per second (MS/s), the electrical sense signals generated by the MEMS device across the drive nodes and sense nodes of the MEMS device responsive to the resonance condition.

The test and measurement system 100 automates the testing so the system may be utilized in a production environment involving testing multiple wafers, each wafer including numerous MEMS devices. The system 100 automatically couples MEMS devices 104 on wafers 106 to the PMU 102 for testing. In this way, the system 100 reduces test time compared to conventional approaches of testing MEMS devices while still on a wafer, and thus the system may be utilized in a production environment. Moreover, the system 100 eliminates components, such as a preamplifier, which are typically required to suitably drive the MEMS devices for testing. More specifically, the PMU 102 generates the required drive signals for exciting or driving the MEMS devices 108 to cause a resonance condition of the MEMS device. The PMU 102 also enables sensing or measuring sense signals on both driving and sensing nodes of the MEMS devices 104 being tested, as described in more detail below.

Figure 2:
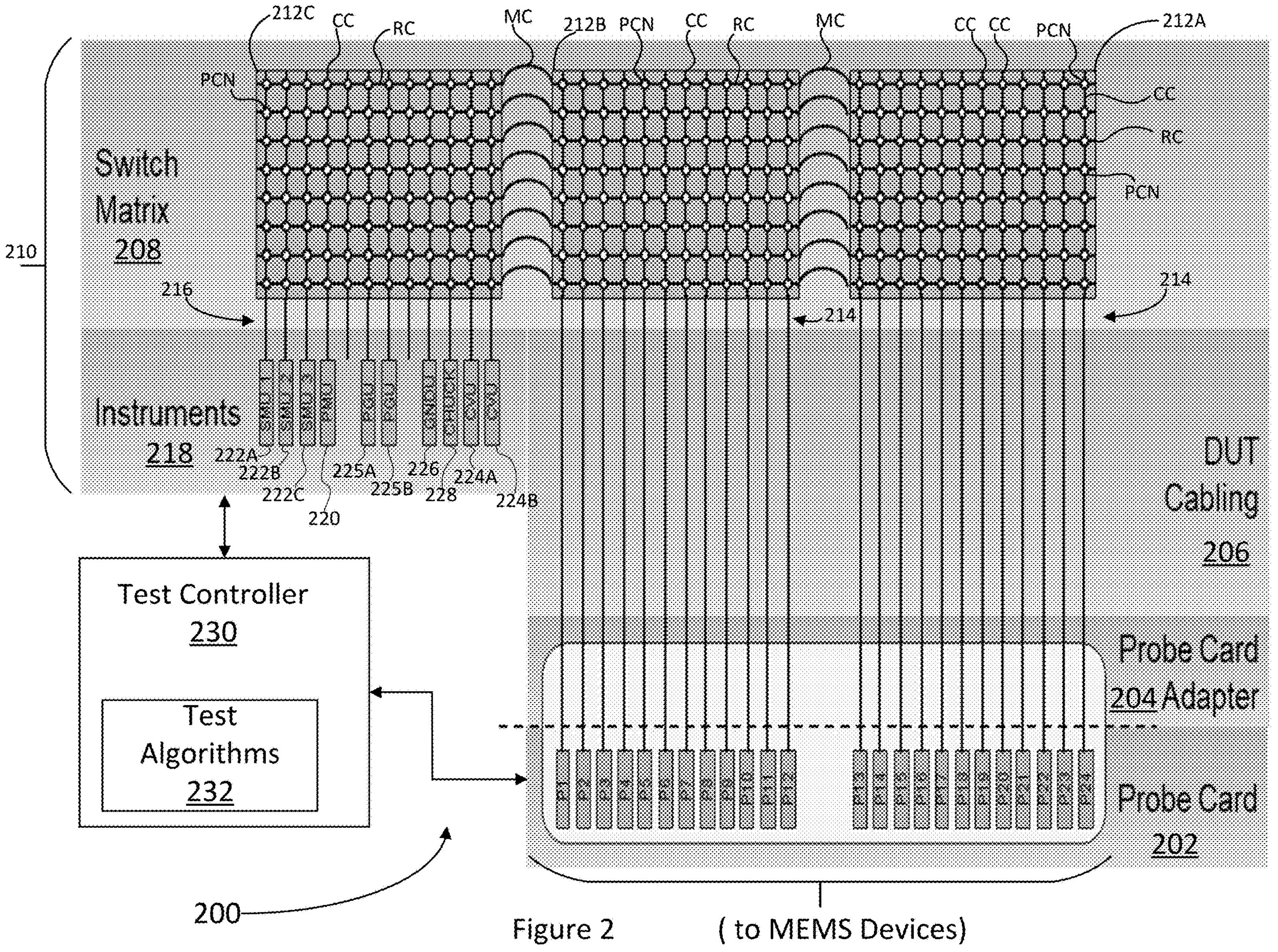
FIG. 2 is a more detailed functional diagram of a test and measurement system according to embodiments of the present disclosure.

FIG. 2 is a more detailed functional diagram of a test and measurement system 200 according to some embodiments of the present disclosure. The test and measurement system 200 corresponds to one embodiment of the test and measurement system 100 of FIG. 1. The test and measurement system 200 includes a probe card 202 having a number of conductive pins P1-P24 in the example embodiment of FIG. 2. The pins P1-P24 represent components of the probe card 202 that mechanically and electrically couple the probe card to the MEMS devices being tested on a wafer (not shown), and also electrically couple the probe card to other components of the test and measurement system 200. A probe card adapter 204 provides an interface between the pins P1-P24 of the probe card 202 and cables 206 which, in turn, are electrically coupled to a switch matrix 208. The wafer including the MEMS devices being tested, along with the probe card 202 and probe card adapter 204, are physically located at a distance from a parametric test subsystem 120 of the test and measurement system 200. The cables 206 provide electrical coupling between the distant probe card 202 and the parametric test subsystem 210.

In the embodiment of FIG. 2, the switch matrix 208 includes three switch sub-matrices 212A-C. Each switch sub-matrix 212A-C includes an array of overlapping column conductors CC and row conductors RC having programmable connection nodes PCN defined at each overlap of a column conductor and row conductor. Only selected ones of the column conductors CC, row conductors RC, and programmable connection nodes PCN are labeled for switch sub-matrix 212A by way of example to simplify the figure. The programmable connection nodes PCN of each switch sub-matrix 212A-C may be programmed to connect each column conductor to a selected one of the row conductors RC of the sub-matrix. Each switch sub-matrix 212A, 212B also has a probe card pin or node 214 defined at one end of each column conductor CC, with the probe card node being a suitable connector or otherwise configured for coupling to a corresponding one of the cables 206.

Each row conductor RC of the switch sub-matrix 212B is coupled through a respective programmable connection node PCN to a corresponding row conductor RC of the switch sub-matrix 212A. A probe card node 214 of each column conductor CC of the switch sub-matrix 212B is also coupled to a corresponding one of the cables 206. Similarly, each row conductor RC of the switch sub-matrix 212B is coupled through a respective programmable connection node PCN to a corresponding row conductor RC of the switch sub-matrix 212C. The switch sub-matrix 212C has an instrument pin or node 216 defined at one end of each column conductor CC, with the instrument node being a suitable connector or otherwise configured for coupling to a corresponding instrument contained in the parametric test subsystem 210.

This structure of the switch matrix 208 enables the switch sub-matrices 212A-212C to be programmed to provide different types of electrical connections between the PMU 220 and the MEMS device coupled to the probe card 202. In one embodiment the switch matrix 208 provides a Kelvin connection or remote voltage sense connection between drive nodes or electrodes of the MEMS device and the PMU 220, and a regular two-wire connection between the PMU and sense nodes or electrodes of the MEMS device. A Kelvin connection, or remote voltage sense connection, is a four-wire connection that allows the PMU 220 to supply a drive signal on the drive nodes and to detect or measure a signal across the drive nodes at the same time. For example, the PMU 220 may provide a force or drive signal over a first pair of signal pathways through the switch matrix 208 to the drive electrodes of the MEMS device and, at the same time, detect or measure a first sense signal across the drive electrodes through a second pair of signal pathways through the switch matrix. In this embodiment, the drive signal is a current signal and the first sense signal is a voltage signal. In the following description, the signal pathways in the switch matrix 208 that supply the current signal to the drive nodes may be referred to as a "force connection" and the signal pathways that sense the voltage signal across the drive nodes may be referred to as a "sense connection."

The parametric test subsystem 210 includes one or more instruments 218, each instrument being electrically coupled to a respective one of the instrument nodes 216 of the switch sub-matrix 212C. One of the instruments 218 contained in the parametric test subsystem 210 is a PMU 220 that is utilized for testing MEMS devices on a wafer, as described in more detail below. The instruments 218 in the example parametric test subsystem 210 of FIG. 2 includes instruments for making measurements for characterizing various types of electronic devices under test (DUT), such as field effect transistors (FETs), bi-polar junction transistors (BJTs), diodes, resistors, capacitors, memories such as FLASH memories, and others. Three types of measurements are typically made by the instruments: 1) precision, DC current and voltage measurement; 2) AC impedance measurements utilizing the capacitance-voltage technique; and 3) pulsed and transient measurements.

In the example embodiment of FIG. 2, the instruments 218 include source measure units (SMUs) 222A-C that measure both voltage and current while sourcing a signal to DUTs, and also include capacitance-voltage units (CVUs) 224A,B to measure capacitances of DUTs and pulse generator units (PGU) 225A,B for making transient measurements of DUTs. A ground unit (GNDU) 226 provides a common reference and return signal path for current signals sourced by the SMUs 222A-C. The instruments 218 further include a chuck 228 for holding a wafer during testing of the DUTs formed on the wafer.

In the test and measurement system 200, a test controller 230 controls the overall operation of the system and executes test algorithms 232 to perform testing of DUTs coupled to the probe card 202. In embodiments of the present disclosure, the test controller 230 executes a test control algorithm 232 to automatically perform testing of the MEMS devices on a wafer coupled to the probe card 202. More specifically, the test controller 230 controls the PMU 220, switch matrix 208, and probe card 202 to sequentially position the probe card to couple selected MEMS devices to the PMU. The PMU 220 excites or applies a drive signal to the selected MEMS device coupled to the probe card 202 and measures sense signals generated by the MEMS device in response to a resonance condition of the MEMS device caused by the drive signal. The drive signal applied by PMU 220 to each MEMS device and the sense signals generated by the MEMS device and sampled by the PMU are discussed in more detail below with reference to FIGS. 4 and 5. The PMU 220 samples these sense signals to generate a data set for each MEMS device, and the test controller 230 utilizes this data set to calculate a quality factor Q for each MEMS device and determine whether the MEMS devices passes a quality factor Q test based on the determined quality factor. For example, the test controller 230 may compare the determined quality factor Q to a threshold and determine the MEMS device passes the test if the determined quality factor is greater than the threshold and the calculated resonance frequency is within a defined range of frequencies.

Figure 3:
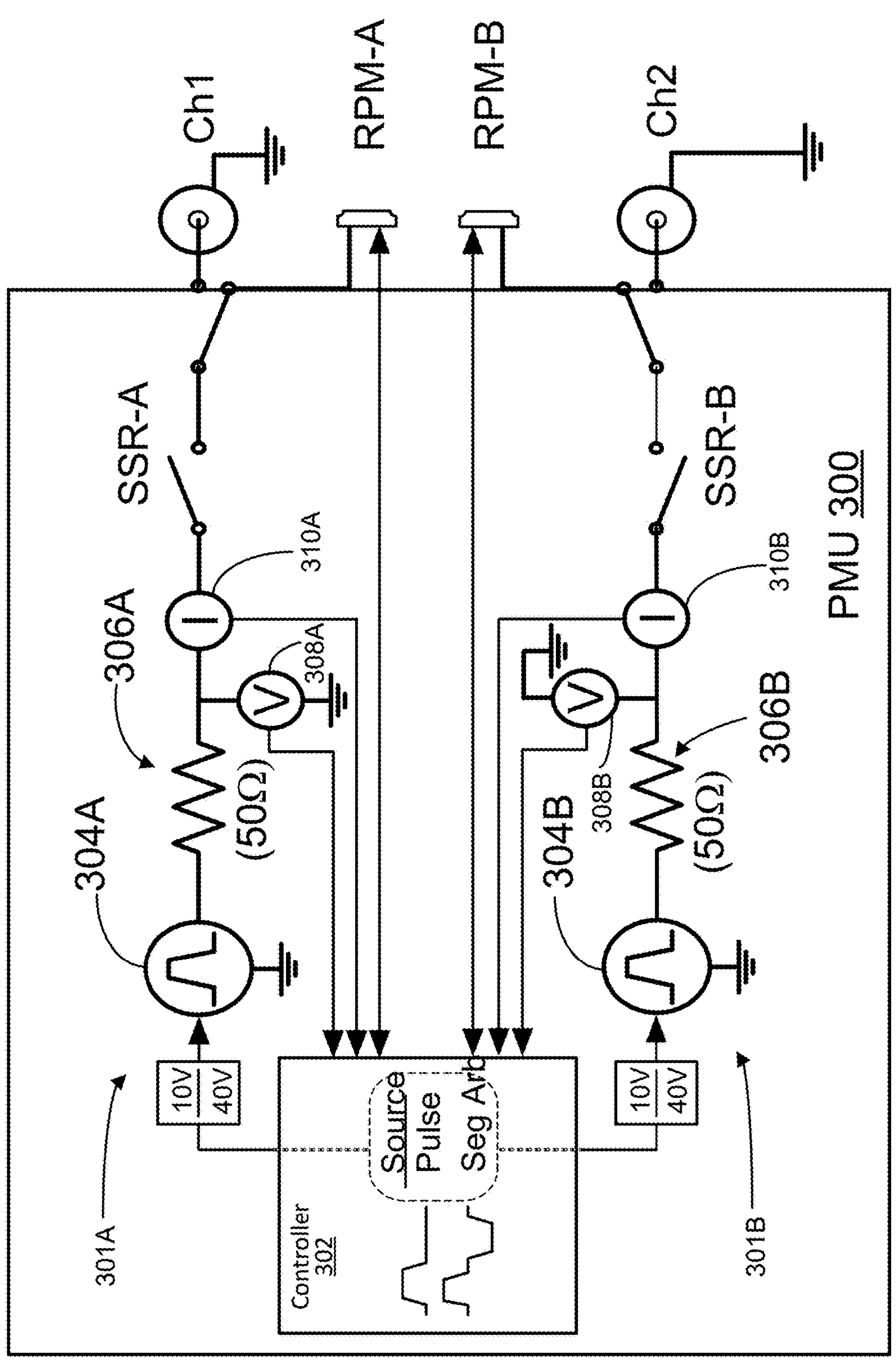
FIG. 3 is a more detailed functional block diagram of the PMU of FIGS. 1 and 2 according to embodiments of the present disclosure.

FIG. 3 is a more detailed functional block diagram of the PMU 102, 220 of FIGS. 1 and 2 according to embodiments of the present disclosure. The PMU 300 includes a controller 302 that controls two pulse generation and sensing channels 301A, 301B. Each channel 301A, 301B includes voltage pulse generation sources 304A, 304B, each of which generates a voltage pulse that is supplied through a characteristic impedance 306A, 306B and solid state relay SSR-A, SSR-B to a MEMS device (not shown in FIG. 3) coupled to a first channel Ch1 and a second channel Ch2 of the PMU 300. The solid state relays SSR-A, SSR-B are useful for high impedance mode when performing program or erase on flash memory via Fowler-Nordheim tunneling. The solid state relays SSR-A. SSR-B may alternately supply voltage pulses from the sources 304A, 304B to remote preamplifier modules RPM-A, RPM-B, which, in turn, provide additional low current measurement functionality for the PMU 300. The PMU 300 and remote preamplifier modules RPM-A, RPM-B combination provides the test capabilities to perform Q-factor measurement methods as described herein. Both channels 301A, 301B have both current and voltage measurement functionality, such as through two analog-to-digital converters (ADC) per channel. Each channel 301A, 301B includes voltage sampling circuits 308A, 308B and current sampling circuits 310A. 310B for sampling the signals on each channel, where each of these sampling circuits may be an ADC. Each channel 301A, 301B can independently source ±10V or ±40V (into high impedance) through the pulse generators 304A, 304B. The PMU 300 has 2 channels of voltage pulse sourcing with integrated, simultaneous real-time current and voltage measurement for each channel. These sample type of measurements is used to capture the time-based current and voltage waveforms critical for understanding transient or dynamic behaviors. The real-time sampling capability is critical to capture the transient behavior of MEMS devices in a single waveform.

Figure 4:
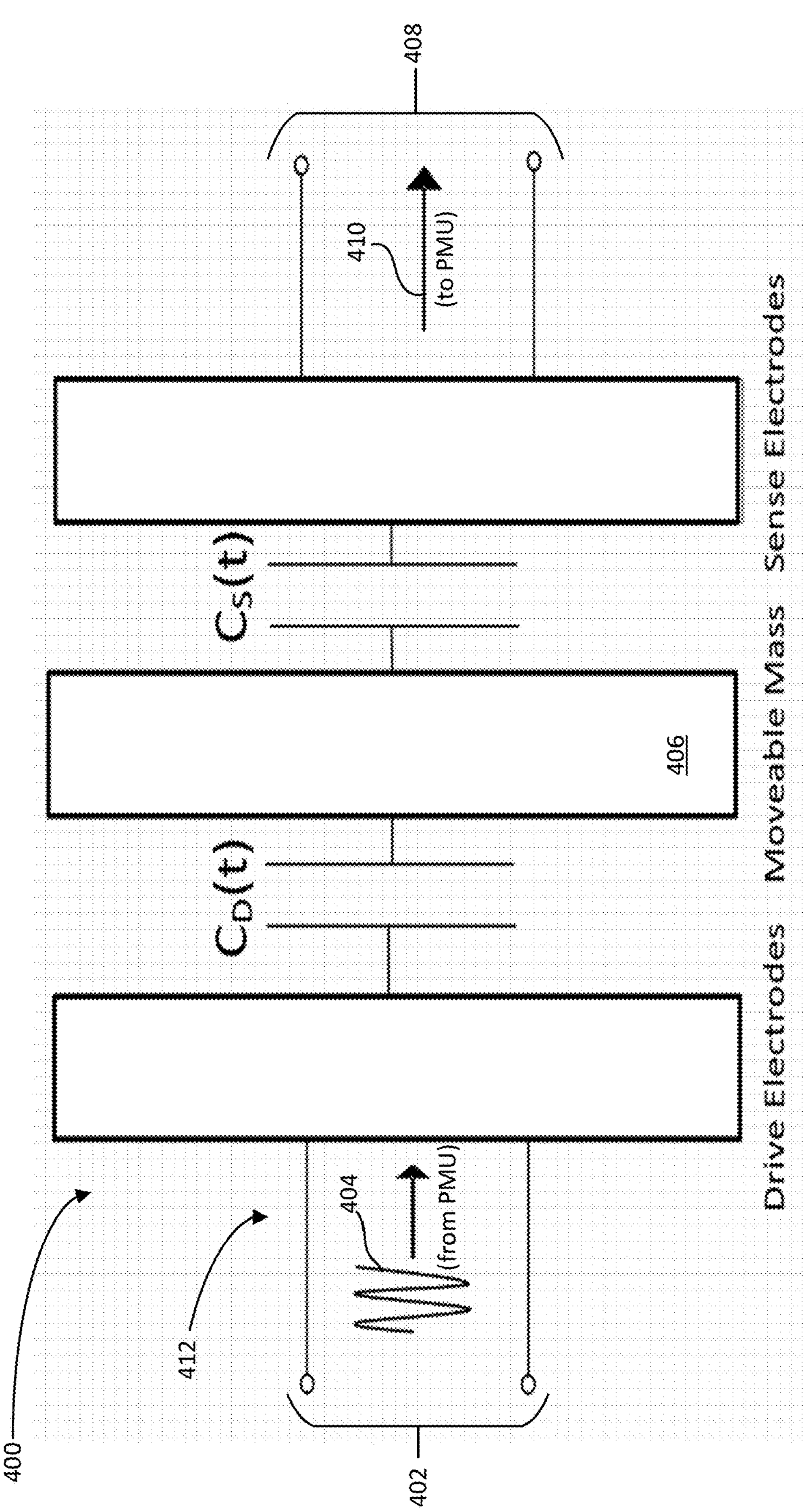
FIG. 4 is a simplified diagram of a MEMS device illustrating drive, movable, and sense components of the device.

FIG. 4 is a simplified diagram of a MEMS device 400 illustrating drive, movable, and sense components of the MEMS device. The structure and operation of resonant MEMS devices will be understood by those skilled in the art, and thus will not be described in detail herein. The simplified MEMS device 400 of FIG. 4 is described briefly to enable a better understanding of the operation of the PMU 102, 220 in supplying drive signals to the MEMS device and in measuring sense signals from the MEMS device in embodiments of the present disclosure. The MEMS device may be a gyroscope or a resonant accelerometer, for example. When the MEMS device is a gyroscope, the gyroscope may have a resonant frequency in the range of 20-24 KHZ and have a quality factor Q in the range of 6000-8000.

The MEMS device 400 includes drive nodes or electrodes 402 on which the PMU 102, 220 applies a time-varying excitation or drive signal 404. The drive electrodes 402 are a fixed structure relative to a substrate on which the MEMS device 400 is formed. A moveable mass 406 is moveable, rotationally or linearly, relative to the drive electrodes 402, and the moveable mass includes electrodes that are capacitively coupled to the drive electrodes as represented through a drive capacitance $C_D(t)$. The MEMS device 400 further includes sense nodes or electrodes 408 on which the PMU 102, 220 measures or senses a time-varying sense signal 410. The sense electrodes 408 are also fixed relative to the substrate on which the MEMS device 400 is formed, and the moveable mass 406 includes electrodes that are capacitively coupled to the sense electrodes as represented through a sense capacitance $C_S(t)$.

In operation, the PMU 102, 220 operates in a drive mode and a sense mode to test the MEMS device 400, which would be one MEMS device on a wafer containing multiple MEMS devices to be tested. In the drive mode, the PMU 102, 220 applies the drive signal 402 to the drive electrodes 402 of the MEMS device. The specific electrical characteristics of the drive signal 404, as well as those of the sense signal 410, will vary and will depend on the type of MEMS device 400 being tested. The MEMS device 400 may be, for example, a gyroscope or a resonant accelerometer. Examples of the drive signal 404 and the sense signal 410 where the MEMS device 400 is a gyroscope will now be described in more detail with reference to FIGS. 5A and 5B. A second sense signal 412 that is generated across the drive electrodes 402 in response to movement of the moveable mass 406 in a sense mode of operation of the MEMS device 400 that occurs during testing is also shown in FIG. 4, as will be described in more detail below.

Figure 5A:
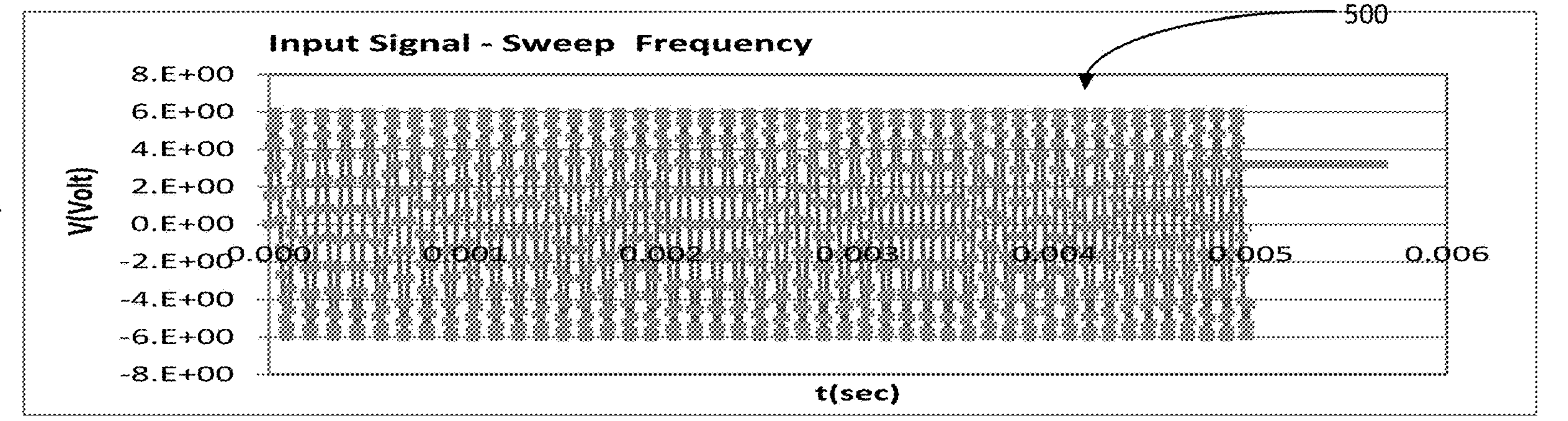
FIGS. 5A and 5B are signal diagrams illustrating signals supplied to the MEMS device and measured from the MEMS device of FIG. 4 by the PMU according to embodiments of the present disclosure.

FIG. 5A illustrates a drive signal 500 having a frequency that is variable over time. Amplitude of the drive signal 500 is shown on the vertical axis and time on the horizontal axis. The signal 500 has a band or range of frequencies over which the signal varies that includes an expected resonance frequency of the movable mass 406 of the MEMS device 400. The drive signal 500 corresponds to one example that may be generated by the PMU 102, 220 in testing the MEMS device 400. The PMU 102, 220 generates the drive signal 500 and this signal is applied through signal pathways in the switch matrix 208 (FIG. 2) to the drive electrodes 402 as the drive signal 404 that is applied to the MEMS device 400. The PMU 102, 220 generates the drive signal 500 for a specified period of time, which is 5 milliseconds (ms) in the example of FIG. 5A. During the time the PMU 102, 220 generates the drive signal 500, the PMU also measures or senses the actual drive signal 404 across the drive electrodes 402 that results from this generated drive signal 500. The PMU 102, 220 measures the actual drive signal 404 through additional signal pathways in the switch matrix 208 (FIG. 2) that are coupled to the drive electrodes 402. The PMU 102, 220 measures the actual drive signal 404 by sampling this signal at a sufficient sampling rate to generate a data set including a set of samples forming a digitized version of drive signal 404. In this way, the PMU 102, 220 captures the actual drive signal 404 applied to the MEMS 400 during the drive mode of operation.

The drive signal 404 across the drive electrodes 402 is capacitively coupled through the variable drive capacitance $C_D(t)$ to the moveable mass 406. This capacitive coupling of the drive signal 404 through the variable drive capacitance $C_D(t)$ causes the moveable mass 406 of the MEMS device 400 to move and to resonate at a resonant frequency that is defined by the mechanical and electrical characteristics of the MEMS device. In the present description, the resonance of the moveable mass 406 may be referred to as a resonant condition of the MEMS device 400. Once the PMU 102, 220 has generated the drive signal 500 for the specified time (i.e., 5 ms in the example of FIG. 5A), the PMU terminates generation of the drive signal to stop the drive mode of operation. The PMU 102, 220 then begins operating in the sense mode of operation and measures the sense signal 410 that is generated across the sense electrodes 408 of the MEMS device 400 in response to the continued resonant movement of the moveable mass 406.

Figure 5B:
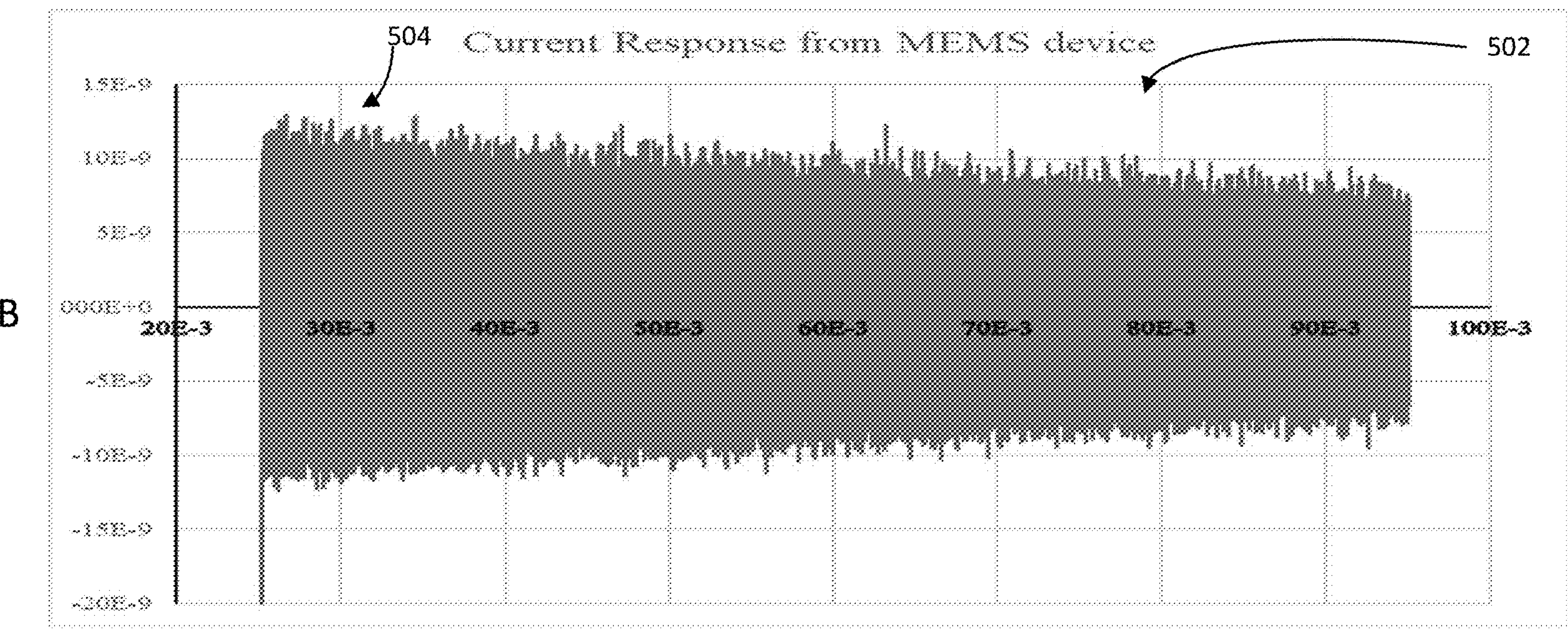

The moveable mass 406 is capacitively coupled to the sense electrodes 408 through the variable sense capacitance $C_S(t)$ and in this way the MEMS device 400 generates the sense signal 410 across the sense electrodes 408 responsive to the movement of the moveable mass. Signal pathways in the switch matrix 208 (FIG. 2) couple the PMU 102, 220 to the sense electrodes 408, and the PMU measures the sense signal 410 by sampling this sense signal at a sufficient sampling rate to generate a data set including a set of samples forming a digitized version of sense signal. FIG. 5B illustrates a sense signal 502 showing an example of the sense signal 410 generated across the sense electrode 408 in response to the PMU 102, 220 applying the drive signal 500 of FIG. 5A to the MEMS device 400. Amplitude of the sense signal 502 is shown on the vertical axis and time on the horizontal axis in FIG. 5B.

In the sense mode of operation, the PMU 102, 220 also measures the second sense signal 412 as mentioned above, and which is generated across the drive electrode 402 due to the resonance of the moveable mass 406 and capacitive coupling through variable drive capacitance $C_D(t)$ to the drive electrodes 402. The same signal pathways in the switch matrix 208 (FIG. 2) that couple the PMU 102, 220 to measure the drive electrode signal 404 may be used in sensing the second sense signal 412 during the sense move of operation. Once again, the PMU 102, 220 measures the second sense signal 412 by sampling this sense signal at a sufficient sampling rate to generate a data set including a set of samples forming a digitized version of the second sense signal. The sense signal 502 of FIG. 5B may also be viewed as representing the second sense signal 412. The sense signals 410, 412 are current signals at the sense and drive nodes 408, 402 that are generated by the MEMS device responsive to the resonance condition of the movable mass 406.

The sense signal 502 exhibits an exponential decay 504 in amplitude as time progresses. This exponential decay 504 of the amplitude of the sense signal 502 over time may be used in calculating resonant frequency and quality factor Q of the MEMS device 400, as will be understood by those skilled in the art.

The PMU 102, 220 enables improved testing of the MEMS device 400 by generating test data for the MEMS device that is not generated with conventional testing approaches. The PMU 102, 220 measures and generates a data set for the actual drive signal 404 supplied to the drive electrodes 402 of the MEMS device 404 being tested. In contrast, conventional testing approaches utilize an arbitrary waveform generator (AWG) or other piece of equipment to generate a desired drive signal, and do not monitor the actual drive signal being applied to the MEMS device being tested. Furthermore, the PMU 102, 220 senses and generates a data set for sense signals 410 and 412 across the sense nodes 408 and drive nodes 402 of the MEMS device during the sense mode of operation. Conventional approaches of testing the MEMS device 400 sense or measure only the sense signal 410 across the sense nodes 408 of the device. This additional data set generated for the second sense signal 412 generated across the drive nodes 402 may provide improved sense signal data for the MEMS device 400 the enables improved determination of the resonant frequency and quality factor Q of the MEMS device.

Figure 6:
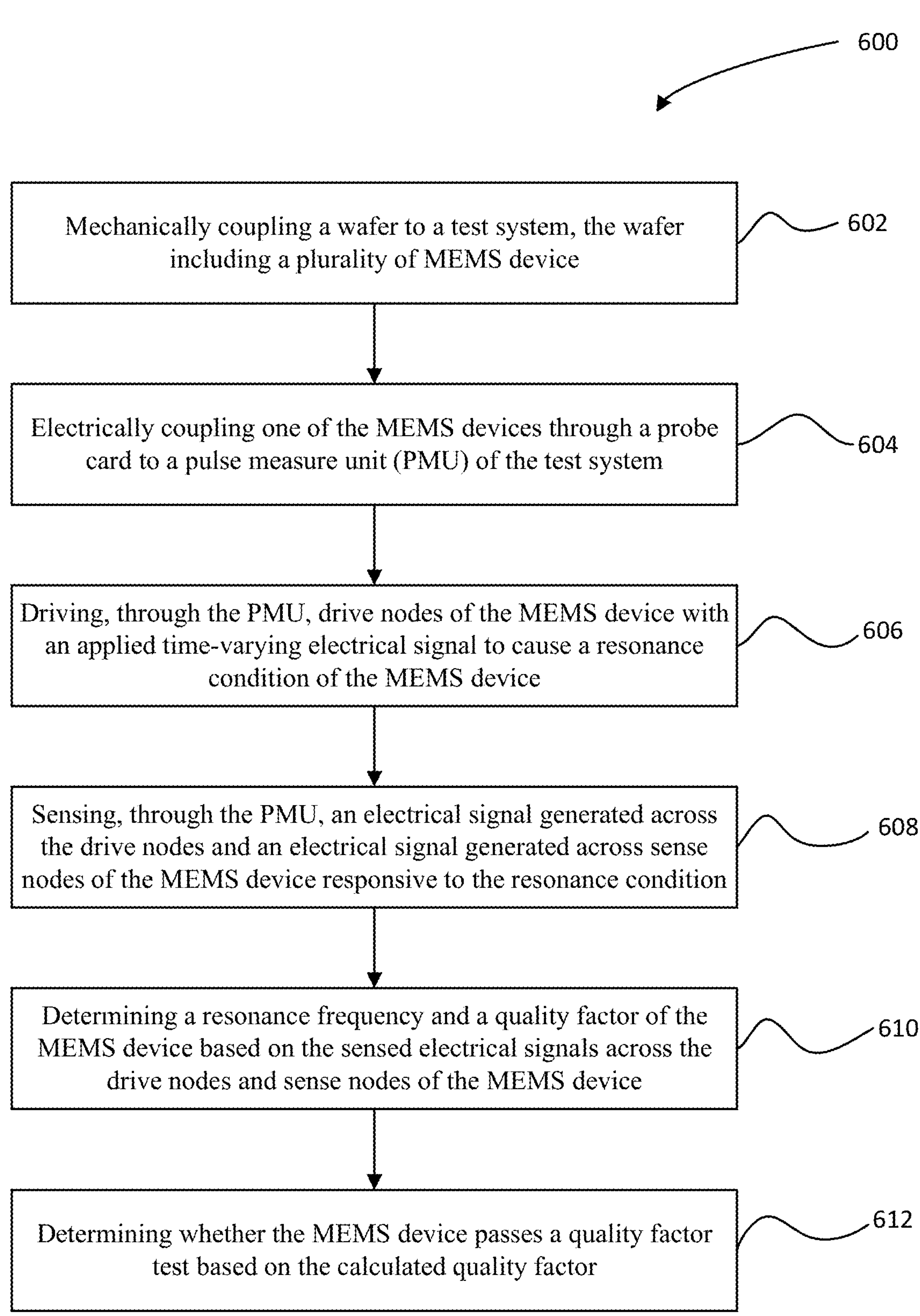
FIG. 6 is a flowchart of an example method of testing a MEMS device in a production environment through a PMU and probe card of a test and measurement instrument according to embodiments of the present disclosure.

FIG. 6 is a flowchart of an example method 600 of testing a MEMS device in a production environment through a PMU and probe card of a test and measurement instrument according to embodiments of the present disclosure. The method 600 will be described in more detail with reference to the test measurement system 200 of FIG. 2. The method 600 begins at an operation 602 and mechanically couples a wafer to a test system, where the wafer includes a number of MEMS devices to be tested. In the test and measurement system 200, mechanically coupling at the operation 602 corresponds to mechanically coupling the wafer to the chuck 228 for holding the wafer during testing of MEMS devices formed on the wafer. From the operation 602 the method 600 proceeds to an operation 604 and electrically couples one of the MEMS devices probe card 202 to PMU 220 of the test system. In some embodiments, this electrical coupling may couple the drive nodes 402 of the MEMS device 400 to the PMU 220 through a Kelvin connection or remote sense connection.

After the operation 604, the method 600 at an operation 606 includes driving, through the PMU 220, drive nodes 402 of the MEMS device with an applied time-varying electrical signal (drive signal 404) to cause a resonance condition of the MEMS device. This time-varying electrical signal may be a sinusoidal signal having a frequency that varies as a function of time. From the operation 606, the method 600 proceeds to and operation 608 that senses, through the PMU 220, an electrical signal, such as sense signal 412, generated across drive nodes 402 and an electrical signal, such as sense signal 410, generated across sense nodes 408 of the MEMS device 400 responsive to the resonance condition. The method 600 proceeds from the operation 608 to an operation 610 and determines a resonance frequency and a quality factor of the MEMS device 400 based on the sensed electrical signals 412, 410 across the drive nodes and sense nodes of the MEMS device. From the operation 610, the method 600 proceeds to an operation 612 and determines whether the MEMS device 400 passes a quality factor test based on the calculated quality factor.

EXAMPLES

Illustrative examples of the technologies disclosed herein are provided below. An embodiment of the technologies may include any one or more, and any combination of, the examples described below.

Example 1 is a method of testing a microelectromechanical (MEMS) device, including mechanically coupling a wafer to a test system, the wafer including a plurality of MEMS devices; electrically coupling one of the MEMS devices through a probe card to a pulse measure unit (PMU) of the test system; driving, through the PMU, drive nodes of the MEMS device with an applied time-varying electrical signal to cause a resonance condition of the MEMS device; sensing, through the PMU, an electrical signal generated across the sense nodes of the MEMS device responsive to the resonance condition; determining a resonance frequency and a quality factor of the MEMS device based on the sensed electrical signals across the sense nodes of the MEMS device; and determining whether the MEMS device passes a quality factor test based on the calculated quality factor.

Example 2 is a method according to Example 1, in which electrically coupling one of the MEMS devices through a probe card to the PMU includes coupling the drive nodes of the MEMS device to the PMU through a Kelvin connection.

Example 3 is a method according to any of the preceding Examples, in which the applied time-varying electrical signal includes a sinusoidal signal having a frequency that varies as a function of time.

Example 4 is a method according to any of the preceding Examples, in which the MEMS device includes one of a gyroscope and a resonant accelerometer.

Example 5 is a method according to any of the preceding Examples, in which the MEMS device includes gyroscope having a resonant frequency in the range of 20-24 KHz and a quality factor in the range of 6000-8000.

Example 6 is a method according to any of the preceding Examples, in which sensing, through the PMU, the electrical signals across the sense nodes includes sensing current signals generated by the MEMS device responsive to the resonance condition.

Example 7 is a method according to any of the preceding Examples, in which electrically coupling one of the MEMS devices through the probe card to the PMU further includes controlling the probe card to sequentially couple each of the MEMS devices on the wafer to the PMU to sequentially determine whether each of the MEMS devices on the wafer passes the quality factor test.

Example 8 is a method according to any of the preceding Examples, in which determining whether the MEMS device passes a quality factor test based on the calculated quality factor includes determining whether the calculated quality factor exceeds a threshold.

Example 9 is a method according to any of the preceding Examples, further comprising sensing, through the PMU, an electrical signal generated across the drive nodes of the MEMS device responsive to the resonance condition, and determining the resonance frequency and quality factor of the MEMS device based on the sensed electrical signals across the sense nodes and the drive nodes of the MEMS device.

Example 10 is a test and measurement system, including a probe card including a plurality of pins, the plurality of pins configured to be electrically coupled to MEMS devices on a wafer; and a test subsystem including a switch matrix including a plurality of probe card pins and a plurality of instrument pins, the plurality of probe card pins configured to be electrically coupled through the probe card to MEMS devices on the wafer and the switch matrix further configured to couple each probe card pin to a selected one of the plurality of instrument card pins; and a pulse measure unit (PMU) coupled to selected ones of the instrument card pins of the switch matrix to electrically couple the PMU through the switch matrix and probe card to a selected one of the MEMS devices, and the PMU configured to provide a time-varying electrical signal on drive nodes of the selected one of the MEMS devices to cause a resonance condition of the MEMS device, and the MEMS device further configured to sense signals generated by the MEMS device across sense nodes of the MEMS device in response to the resonance condition, the sense signals across the sense nodes indicating a resonance frequency and quality factor of the MEMS device.

Example 11 is a test and measurement system according to Example 10, in which the test subsystem is further configured to determine a resonance frequency and calculate a quality factor of the MEMS device using the sense signals, and to determine whether the MEMS device passes a quality factor test based on the determined resonance frequency and calculated quality factor.

Example 12 is a test and measurement system according to Example 11, wherein the PMU is further configured to sense signals generated by the MEMS device across the drive nodes in response to the resonance condition, and wherein the test subsystem is further configured to determine the resonance frequency and calculate the quality factor of the MEMS device using the sense signal across the sense nodes and the drive nodes.

Example 13 is a test and measurement system according to preceding Examples 10-12, in which the switch matrix is further configured to provide a Kelvin connection to the drive nodes of the selected MEMS device.

Example 14 is a test and measurement system according to preceding Examples 10-13, in which the MEMS device includes one of a gyroscope and a resonant accelerometer.

Example 15 is a test and measurement system according to preceding Example 14, in which the MEMS device includes a gyroscope having a resonant frequency in the range of 20-24 KHz and a quality factor in the range of 6000-8000.

Example 16 is a test and measurement system according to preceding Examples 10-15, in which the time-varying electrical signal includes a sinusoidal signal having a frequency that varies as a function of time.

Example 17 is a test and measurement system according to preceding Examples 10-16, in which time-varying electrical signal is a time-varying voltage signal and each of the sense signals is a current signal.

Example 18 is a test and measurement system according to preceding Examples 10-17, in which the test subsystem includes a semiconductor parametric test system.

Example 19 is a test and measurement system according to preceding Examples 10-18, in which the switch matrix and the probe card are further configured to sequentially couple the drive nodes and sense nodes of each of the MEMS devices on the wafer to the PMU to determine a resonance frequency and quality factor of each of the MEMS devices on the wafer.

Example 20 is a test and measurement system according to preceding Examples 10-18, in which the PMU is configured to apply pulse signals having pulse widths that may vary from 60 ns to DC to generate the time-varying electrical signal and is further configured to sample the electrical signals generated by the MEMS device across the drive nodes and sense nodes responsive to the resonance condition at a rate of up to 200 mega samples per second (Ms/s).

Example 21 is a test and measurement system, including a probe card configured to be electrically coupled to MEMS devices on a wafer; and a test subsystem, including a switch matrix configured to provide switchable signal pathways between probe card pins and instrument pins, the probe card pins being coupled to the probe card; a pulse measure unit (PMU) coupled to selected ones of the instrument pins of the switch matrix to electrically couple the PMU through the switch matrix and probe card to a selected one of the MEMS devices, and the PMU configured to provide a drive signal on drive nodes of the selected one of the MEMS devices to cause a resonance condition of the MEMS device, and the PMU further configured to sense signals generated by the MEMS device across sense nodes of the MEMS device in response to the resonance condition, the sense signals indicating a resonance frequency and quality factor of the MEMS device; and processing circuitry configured to analyze the sense signals to calculate a resonance frequency and determine a quality factor of the MEMS device, and to determine whether the MEMS device passes a quality factor test based on the calculated quality factor and resonant frequency.

Example 22 is a test and measurement system according to Example 21, in which the drive signal comprises a sinusoidal signal having a frequency that varies as a function of time.

Example 23 is a test and measurement system according to preceding Examples 21-22, wherein the PMU is further configured to sense signals generated by the MEMS device across the drive nodes of the MEMS device in response to the resonance condition, and wherein the processing circuitry is further configured to analyze the sense signals across the drive nodes and the sense nodes to calculate the resonance frequency and determine the quality factor of the MEMS device, and determine whether the MEMS device passes a quality factor test based on the calculated quality factor and resonant frequency.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

We claim:

1. A method of testing a microelectromechanical (MEMS) device, comprising:

mechanically coupling a wafer to a test system, the wafer including a plurality of MEMS devices;

electrically coupling one of the MEMS devices through a probe card to a pulse measure unit (PMU) of the test system;

driving, through the PMU, drive nodes of the MEMS device with an applied time-varying electrical signal to cause a resonance condition of the MEMS device;

simultaneously sampling, through the PMU, voltage and current of an electrical signal generated across sense nodes of the MEMS device responsive to the resonance condition;

determining a resonance frequency and a quality factor of the MEMS device based on the sampled electrical signals across the sense nodes of the MEMS device; and determining whether the MEMS device passes a quality factor test based on the determined quality factor.

2. The method of claim 1, wherein electrically coupling one of the MEMS devices through a probe card to the PMU comprises coupling the drive nodes of the MEMS device to the PMU through a Kelvin connection.

3. The method of claim 1, wherein the applied time-varying electrical signal comprises a sinusoidal signal having a frequency that varies as a function of time.

4. The method of claim 1, wherein the MEMS device comprises one of a gyroscope and a resonant accelerometer.

5. The method of claim 4, wherein the MEMS device comprises a gyroscope having a resonant frequency in a range of 20-24 KHz and a quality factor in a range of 6000-8000.

6. The method of claim 1, wherein the PMU is configured to sample voltage and current simultaneously on each of two channels, one of which is configured to simultaneously sample the voltage and the current of the electrical signal across the sense nodes.

7. The method of claim 1, wherein electrically coupling one of the MEMS devices through the probe card to the PMU further comprises controlling the probe card to sequentially couple each of the MEMS devices on the wafer to the PMU to sequentially determine whether each of the MEMS devices on the wafer passes the quality factor test.

8. The method of claim 1, wherein determining whether the MEMS device passes a quality factor test based on the determined quality factor comprises determining whether the determined quality factor exceeds a threshold.

9. The method of claim 1, further comprising:

sensing, through the PMU, an electrical signal generated across the drive nodes of the MEMS device responsive to the resonance condition; and determining the resonance frequency and quality factor of the MEMS device based on the sampled electrical signals across the sense nodes and the drive nodes of the MEMS device.

10. A test and measurement system, comprising:

a probe card including a plurality of pins, the plurality of pins configured to be electrically coupled to MEMS devices on a wafer; and a test subsystem including:

a switch matrix including a plurality of probe card pins and a plurality of instrument pins, the plurality of probe card pins configured to be electrically coupled through the probe card to MEMS devices on the wafer and the switch matrix further configured to couple each probe card pin to a selected one of the plurality of instrument pins; and a pulse measure unit (PMU) coupled to selected ones of the instrument pins of the switch matrix to electrically couple the PMU through the switch matrix and probe card to a selected one of the MEMS devices, and the PMU configured to provide a time-varying electrical signal on drive nodes of the selected one of the MEMS devices to cause a resonance condition of the MEMS device, and the PMU is further configured to simultaneously sample voltage and current of signals generated by the MEMS device across sense nodes of the MEMS device in response to the resonance condition, the sampled signals across the sense nodes indicating a resonance frequency and quality factor of the MEMS device.

11. The test and measurement system of claim 10, wherein the test subsystem is further configured to determine a resonance frequency and calculate a quality factor of the MEMS device using the sampled signals, and to determine whether the MEMS device passes a quality factor test based on the determined resonance frequency and calculated quality factor.

12. The test and measurement system of claim 11, wherein the PMU is further configured to sample signals generated by the MEMS device across the drive nodes in response to the resonance condition, and wherein the test subsystem is further configured to determine the resonance frequency and calculate the quality factor of the MEMS device using the sampled signal across the sense nodes and the drive nodes.

13. The test and measurement system of claim 10, wherein the switch matrix is further configured to provide a Kelvin connection to the drive nodes of the selected MEMS device.

14. The test and measurement system of claim 10, wherein the MEMS device comprises one of a gyroscope and a resonant accelerometer.

15. The test and measurement system of claim 14, wherein the MEMS device comprises a gyroscope having a resonant frequency in a range of 20-24 KHz and a quality factor in a range of 6000-8000.

16. The test and measurement system of claim 10, wherein the time-varying electrical signal comprises a sinusoidal signal having a frequency that varies as a function of time.

17. The test and measurement system of claim 10, wherein time-varying electrical signal is a time-varying voltage signal.

18. The test and measurement system of claim 10, wherein the test subsystem comprises a semiconductor parametric test system.

19. The test and measurement system of claim 10, wherein the switch matrix and the probe card are further configured to sequentially couple the drive nodes and sense nodes of each of the MEMS devices on the wafer to the PMU to determine a resonance frequency and quality factor of each of the MEMS devices on the wafer.

20. The test and measurement system of claim 10, wherein the PMU is configured to apply pulse signals having pulse widths that may vary from 60 ns to DC to generate the time-varying electrical signal and is further configured to sample the electrical signals generated by the MEMS device across the drive nodes and sense nodes responsive to the resonance condition at a rate of up to 200 mega samples per second (Ms/s).

21. A test and measurement system, comprising:

a probe card configured to be electrically coupled to MEMS devices on a wafer; and a test subsystem, including:

a switch matrix configured to provide switchable signal pathways between probe card pins and instrument pins, the probe card pins being coupled to the probe card;

a pulse measure unit (PMU) coupled to selected ones of the instrument pins of the switch matrix to electrically couple the PMU through the switch matrix and probe card to a selected one of the MEMS devices, and the PMU configured to provide a drive signal on drive nodes of the selected one of the MEMS devices to cause a resonance condition of the MEMS device, and the PMU further configured sense simultaneously sample voltage and current of signals generated by the MEMS device across sense nodes of the MEMS device in response to the resonance condition, the sampled signals indicating a resonance frequency and quality factor of the MEMS device; and processing circuitry configured to analyze the sampled signals to determined a resonance frequency and determine a quality factor of the MEMS device, and to determine whether the MEMS device passes a quality factor test based on the determined quality factor and the determined resonant frequency.

22. The test and measurement system of claim 21, wherein the drive signal comprises a sinusoidal signal having a frequency that varies as a function of time.

23. The test and measurement system of claim 21, wherein the PMU is further configured to sample signals generated by the MEMS device across the drive nodes of the MEMS device in response to the resonance condition, and wherein the processing circuitry is further configured to analyze the sampled signals across the drive nodes and the sense nodes to calculate the resonance frequency and determine the quality factor of the MEMS device, and determine whether the MEMS device passes a quality factor test based on the determined quality factor and resonant frequency.

* * * * *